United States Patent [19]

Kusmierz et al.

[11] Patent Number: 4,496,828

[45] Date of Patent: Jan. 29, 1985

[54] SUSCEPTOR ASSEMBLY

[75] Inventors: Marvin A. Kusmierz; Robert F. Pijaszek, both of Bay City, Mich.

[73] Assignee: Ultra Carbon Corporation, Bay City, Mich.

[21] Appl. No.: 511,859

[22] Filed: Jul. 8, 1983

[51] Int. Cl.³ .................. C23C 13/08; H05B 1/00
[52] U.S. Cl. ........................ 219/405; 118/730; 118/50.1; 219/354
[58] Field of Search ............ 219/405, 411, 354, 388, 219/85 BA, 85 BM; 118/50.1, 724, 725, 728, 729, 730

[56] References Cited

U.S. PATENT DOCUMENTS

| | | | |
|---|---|---|---|
| 3,603,284 | 9/1971 | Garnache | 118/725 |
| 3,623,712 | 11/1971 | McNeilly | 118/725 |
| 3,637,434 | 1/1972 | Nakanuma | 118/725 |
| 3,796,182 | 3/1974 | Rosler | 118/728 |
| 3,862,397 | 1/1975 | Anderson | 219/405 |
| 4,022,939 | 5/1977 | Roth | 118/730 |
| 4,099,041 | 7/1978 | Berkman | 118/728 |
| 4,217,856 | 8/1980 | Kraus | 118/724 |

Primary Examiner—Roy N. Envall, Jr.
Assistant Examiner—Teresa J. Walberg
Attorney, Agent, or Firm—Learman & McCulloch

[57] ABSTRACT

A susceptor for holding substrates during a high temperature vapor deposition process is constructed from separable top, bottom and side plates interlocked to each other in a gravity maintained assembly.

20 Claims, 14 Drawing Figures

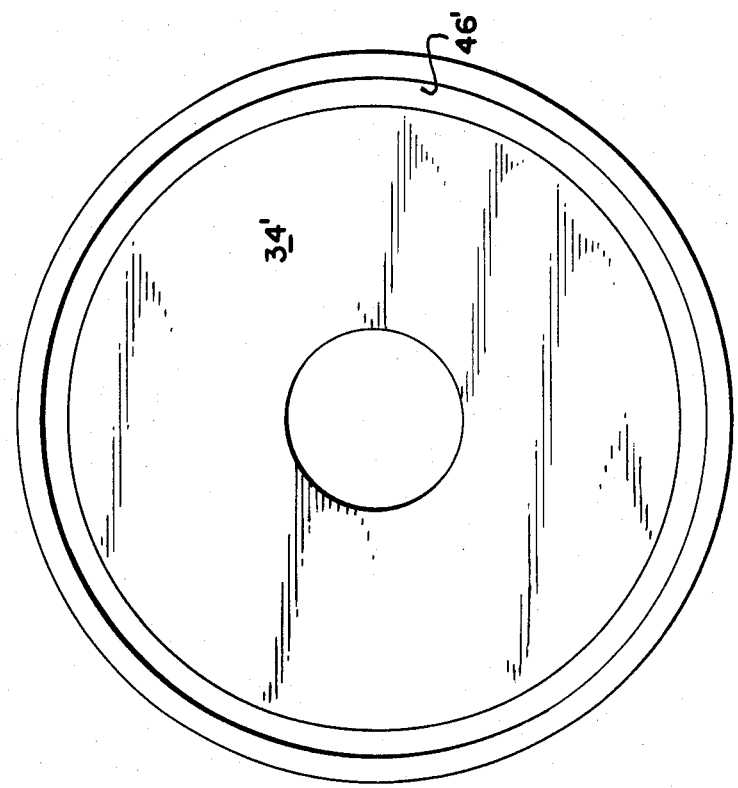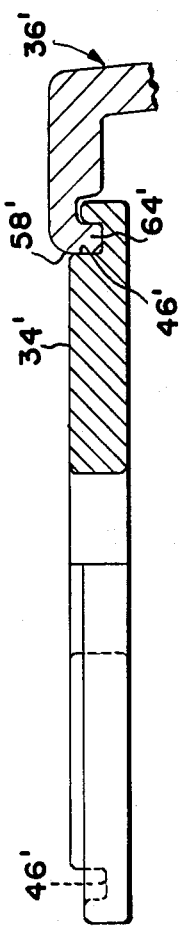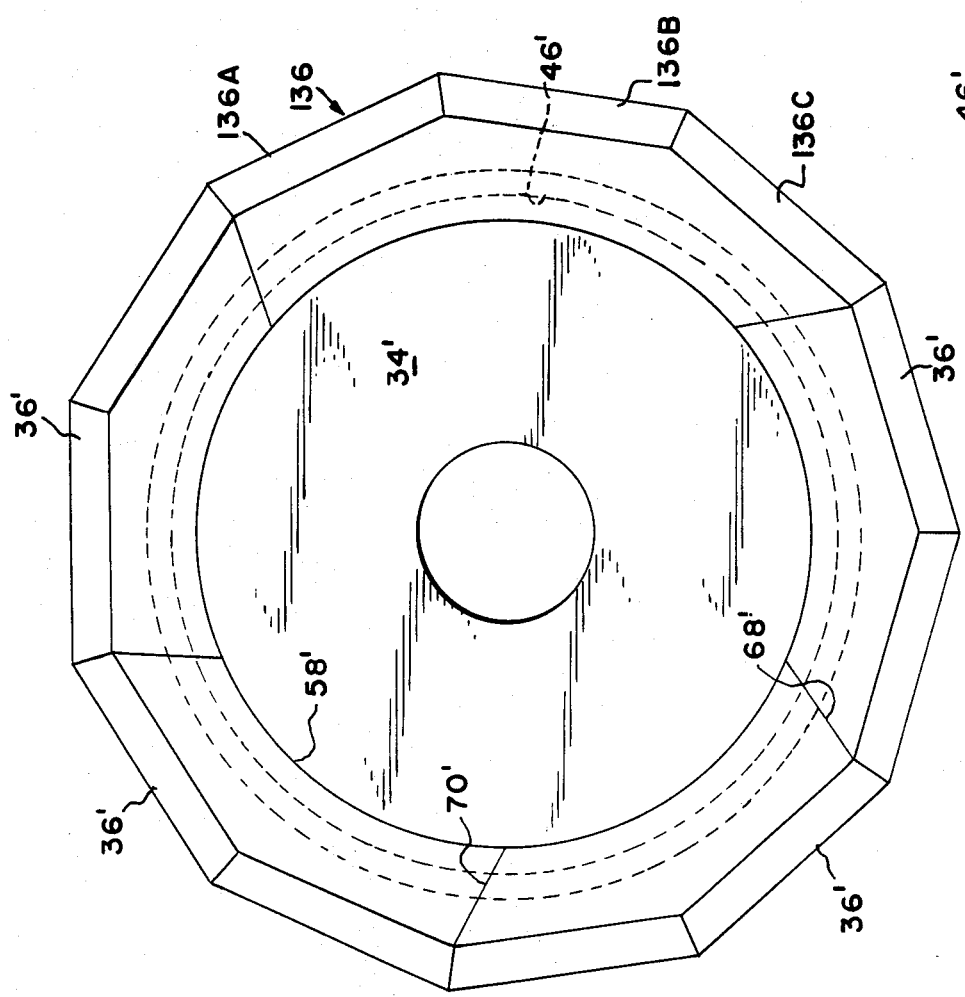

4,496,828

SUSCEPTOR ASSEMBLY

BACKGROUND OF THE INVENTION

The present invention is concerned with susceptors of the type employed to support a plurality of disc-like substrates or the like, typically silicon discs or wafers, within a reactor during a high temperature vapor deposition operation. This particular process is well-known in the art, see, for example, Rosler U.S. Pat. No. 3,796,182, and the McNeilly et al U.S. Pat. No. 3,623,712 cited therein as disclosing a cool wall radiation heated system.

To assist in achieving uniform deposition, it is conventional practice to rotate the susceptor during the deposition process and the susceptor is therefore constructed to be symmetrical about a vertical axis of rotation. Because the discs which the susceptor is to hold are flat, the conventional susceptor configuration is of a polygonal transverse or horizontal cross section with the respective sides inclined inwardly toward the axis in their upward extent. Each of the polygonal side surfaces is conventionally formed with a plurality of circular pockets in which the discs are placed. The susceptors are conventionally formed of graphite coated with a silicon carbide coating or another material which is opaque to radiant heat energy and absorbs the same to be heated thereby, for reasons well-known to those skilled in the art.

Today's typical susceptor is conventionally constructed as a one-piece or permanently assembled article. As noted in the above identified Rosler patent, it is much more convenient to load the discs to be treated onto the susceptor when the face upon which the discs are being loaded is in a horizontal position. Because the discs merely rest in their pockets, it is not possible with a one-piece or permanently assembled susceptor to dispose all of the side surfaces in a horizontal position during the loading operation. The solution to this problem proposed in the Rosler U.S. Pat. No. 3,796,182 is to construct each of the side surfaces of the susceptor in the form of a separate slab which can be loaded in a horizontal position and then hung onto a frame.

While the Rosler patent broadly teaches the advantages of constructing a susceptor with removable side walls, the structural arrangement proposed by Rosler has several disadvantages. As pointed out by Rosler, in addition to functioning as a holder for the discs, the susceptor itself absorbs heat from the reactor and transmits this heat to the discs which it holds during the deposition process. In monitoring this process, heat sensors are located to sense the temperature of the susceptor slabs and modulate the heat radiation producing lamps accordingly. In order to obtain an accurate or undistorted reading from the heat sensors, it is necessary to shield the sensors from direct exposure to the susceptor surrounding radiant heating elements of the reactor. The individual slabs of the Rosler arrangement are widely spaced from each other which makes such shielding difficult.

SUMMARY OF THE INVENTION

In accordance with the present invention, a susceptor is constructed with separable top, bottom and side plates which interfit and interlock with each other when assembled to form an enclosed unit. It is a prime object of the invention to provide a susceptor unit which better resists high temperature warpage and so better retains the substrates and permits easy disassembly and reassembly. Another object of the invention is to provide an assembly which is made up of easily replaced sections. Still another object of the invention is to provide an assembly which promotes the achievement of uniform temperature profiles to produce higher quality wafers and prevents radiation from reaching the interior of the susceptor enclosure. Still a further object of the invention is to provide a susceptor which can be economically manufactured of expensive material without the waste which occurs when a one piece cylindrical unit is produced and the core must be scrapped.

The invention may take the form of an assembly in which a top plate is suspended from the bottom of a vertical shaft and is formed with an upwardly opening groove in its upper surface spaced at a uniform distance inwardly from its periphery. Each side plate may be formed with a downwardly projecting flange offset inwardly from its inner side surface at the top of the side plate, the flange being adapted to be seated within a segment of the groove in the top plate. A generally similar, but upwardly projecting flange may extend along the inner side of each side plate at its bottom, and a bottom plate with a downwardly facing groove in its lower surface may be seated upon and cooperatively supported by the bottom flanges of the side walls.

The longitudinal side edges of the side plates are complementary and, when the side plates are all assembled to the top and bottom plates, the side edges of the adjacent plates are in flush face-to-face engagement with each other. In essence, the top plate of the assembly is suspended from a shaft, the side plates are suspended from the top plate and the bottom plate is suspended from the side plates. The planes of the longitudinal side edges may be so oriented as to be non-radial to the central susceptor axis so that there is no direct linear path for which heat rays from external radiant heaters can reach the interior of the assembled susceptor, thereby shielding heat sensors located in the interior from direct exposure to the heaters.

Other objects and features of the invention will become apparent by reference to the following specification and to the drawings.

IN THE DRAWINGS

FIG. 12 is a top plan view of a modified form of susceptor;

FIG. 13 is a top plan view of the top plate of the suspector of FIG. 12; and

FIG. 14 is a side elevational view of the top plate of FIG. 13, partially in section.

Figure 1:
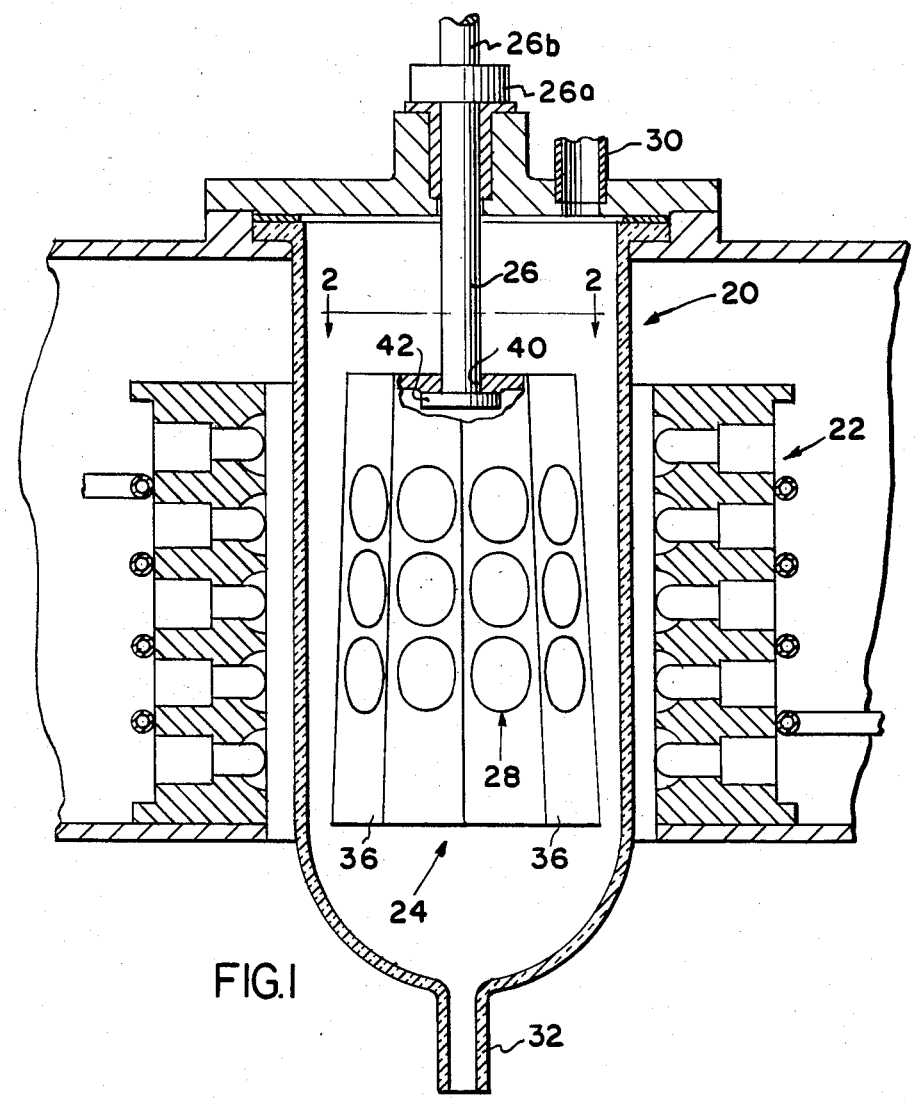
FIG. 1 is a partial cross-sectional view, taken in a vertical plane, through a reactor showing the susceptor of the present invention in place.

In FIG. 1 there is shown the general reactor environment in which the susceptors of the present invention are employed. An enclosed chamber 20 is surrounded by an annular array of radiant heating units designated generally 22, such as a surrounding bank of tungsten filament, quartz-iodine, high intensity lamps capable of producing high filament temperatures in the range of 5000° to 6000° F. The lamps chosen typically are those capable of producing maximum radiant heat energy in the short wave length range, preferably approximately one micron. The susceptor, designated generally 24, is suspended within chamber 20 from the lower end of a vertically disposed shaft 26. Shaft 26 is coupled as at 26a to a rotary drive means 26b, and may be driven in rotation at a relatively low speed.

The exterior surface of susceptor 24 is provided with a plurality of circular pockets such as 28 in which discs or wafers to be treated are seated, the discs simply resting within the pockets 28. Other types of supports for the substrates, whatever their shape, may also be utilized. Vapor which is to be deposited on the exposed surfaces of the discs is fed into the interior of chamber 20 through an inlet pipe 30 at its upper end and is withdrawn from an outlet pipe 32 at the lower end of the chamber. Chamber 20 is formed by a quartz jar, or the like, which is transparent to heat energy emanating from the lamps 22.

The present invention is directed specifically to the construction of the susceptor designated generally 24. Referring now particularly to FIGS. 3–10, it is seen that the susceptor is assembled (FIG. 3) from a plurality of separable individual heat absorbing elements which include a top plate 34, a plurality of side plates 36 which, in the embodiment of FIGS. 1–11, are of identical construction, and a bottom plate 38. Circumferentially spaced heat sensors are normally provided within the enclosure and connected with a control system for certain lamps 22 to maintain a constant temperature around the susceptor. If the operation of the sensors is distorted by the entrance of rays of heat the heat profile around the enclosure may be distorted and the quality of the wafers deleteriously affected.

Figure 2:
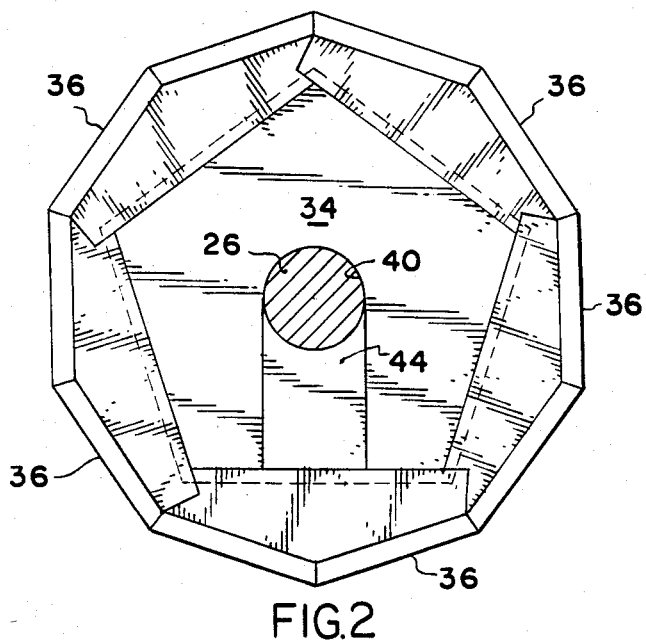
FIG. 2 is a cross-sectional view taken on the line 2—2 of FIG. 1.
Figure 3:
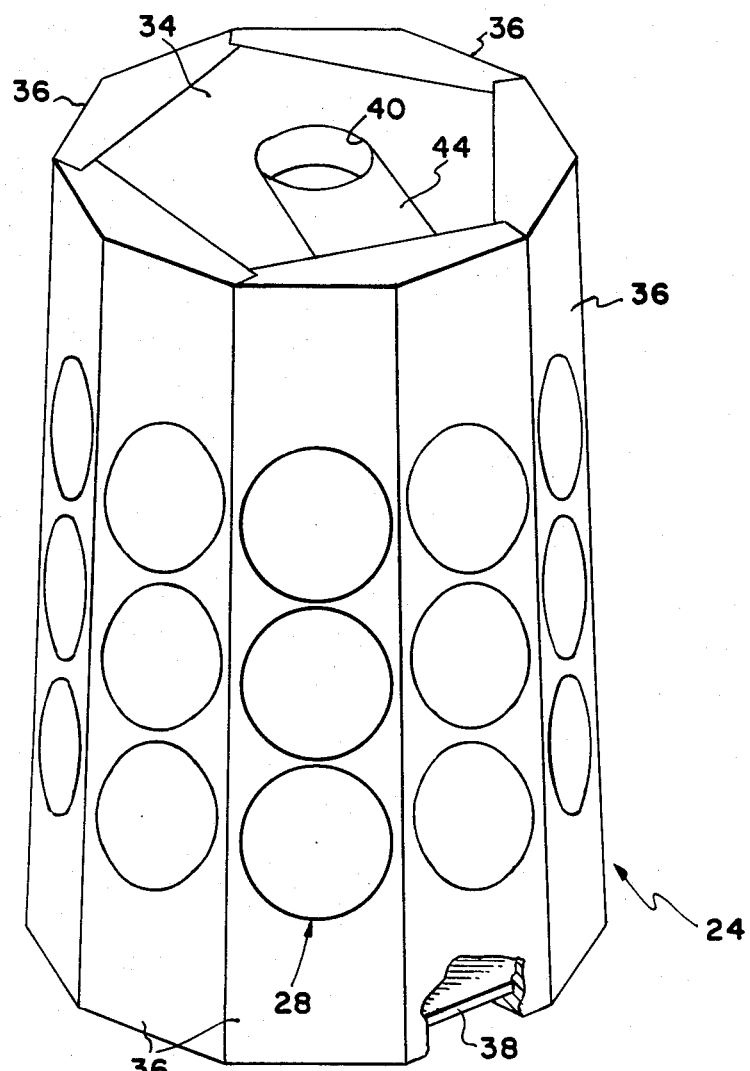
FIG. 3 is a perspective view of the susceptor of FIG. 1, with certain parts broken away or shown in section.
Figure 4:
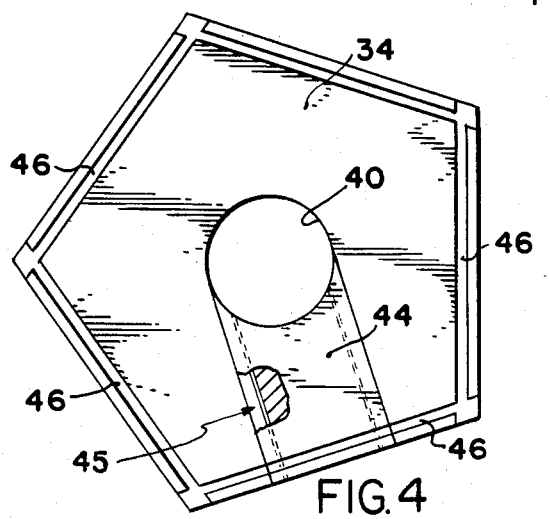
FIG. 4 is a top plan view of the top plate of the susceptor.
Figure 6:
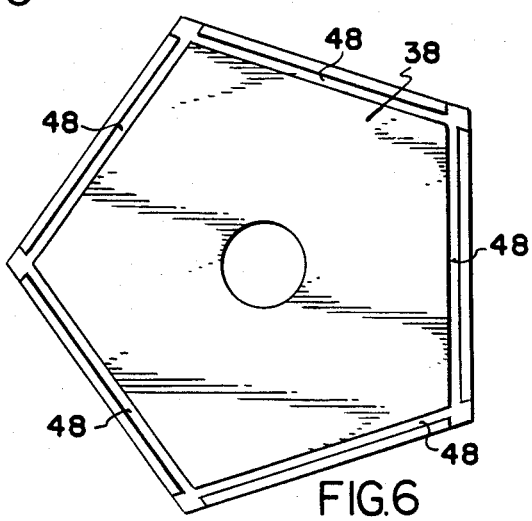
FIG. 6 is a bottom plan view of the bottom plate.
Figure 5:
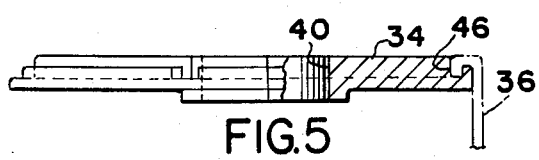
FIG. 5 is a side elevational view, partially in section, of the top plate.
Figure 7:
FIG. 7 is a side elevational view, partially in cross section, of the bottom plate.

In the embodiment of FIGS. 1–11, the top plate 34 is of a regular pentagonal configuration and is formed with a central bore 40, which, as best seen in FIG. 2, is adapted to receive the shaft 26 of the reactor. As best seen in FIG. 1, the shaft 26 is formed with an enlarged boss 42 at its lower end, and to assemble top plate 34 upon shaft 26, a section 44 of the top plate is made separable, as by a tongue and groove sliding interfit 45 (see FIG. 3) so that the section 44 may be completely withdrawn, the top plate seated upon shaft 26 and then held in place by replacing section 44. Upwardly opening grooves 46 are formed in the upper surface of top plate 34 and extend parallel to each side edge of the top plate at uniform distances inwardly from the outer periphery of the top plate.

Bottom plate 38 is of a configuration similar to top plate 34. Downwardly opening grooves 48 are formed in the bottom surface of bottom plate 38 and extend parallel to each of the side edges of bottom plate 38 at uniform distances inwardly from the respective side edges.

Figure 9:
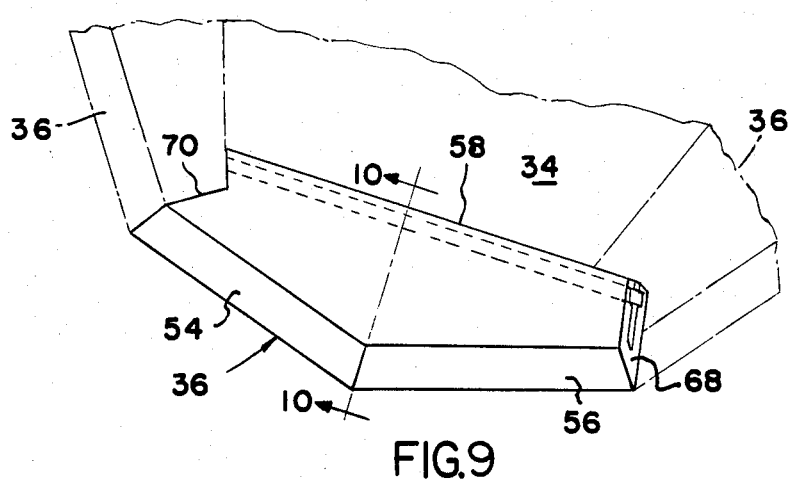
FIG. 9 is a top plan view of the side plate.
Figure 8:
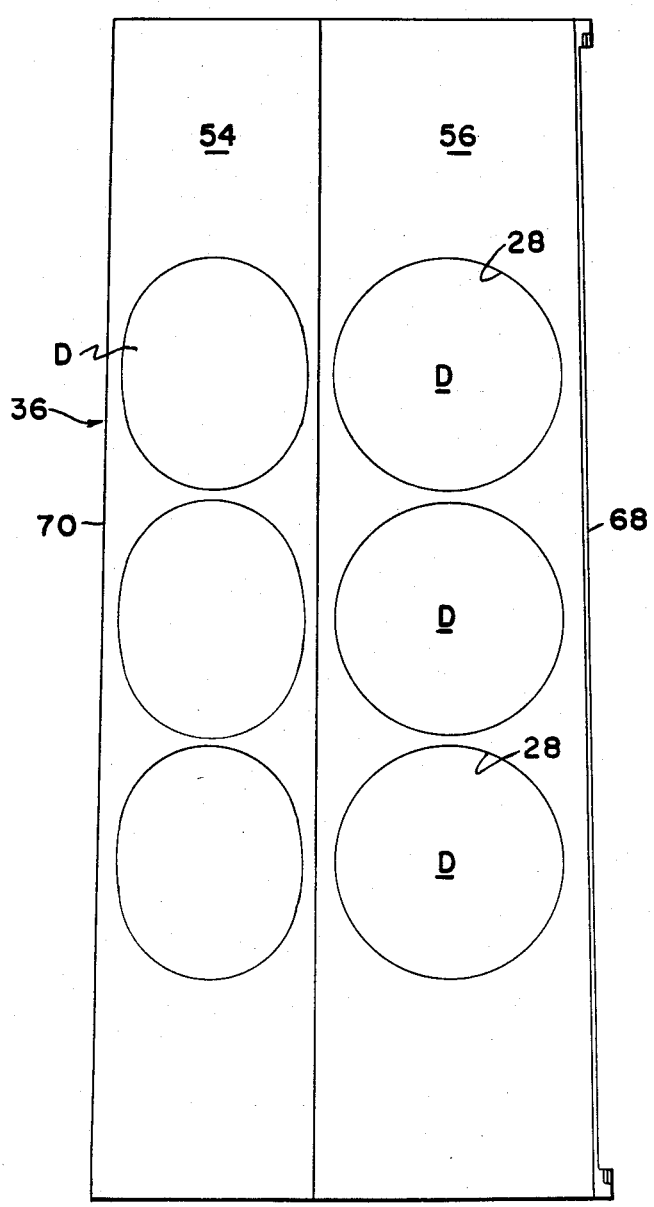
FIG. 8 is a side elevational view of one of the side plates.
Figure 10:
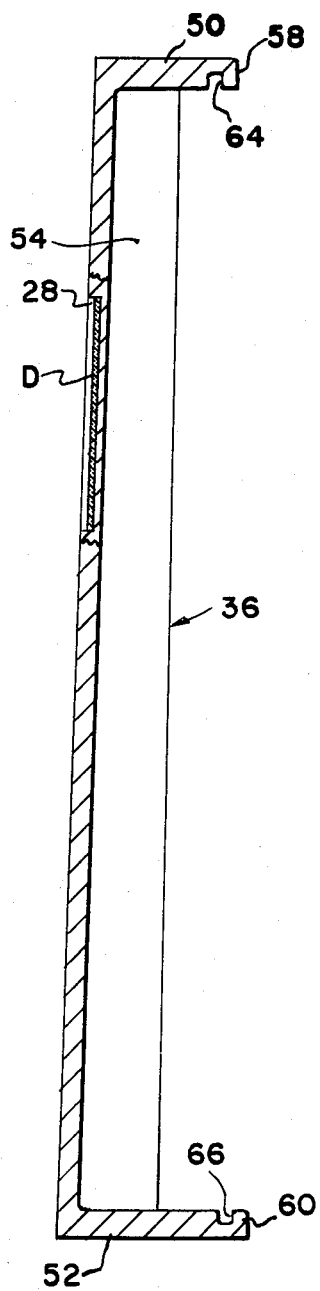
FIG. 10 is a detail cross-sectional view taken on the line 10—10 of FIG. 9.

In the embodiment of FIGS. 1–11, each of the side plates 36 is of identical construction, as best shown in FIGS. 8–10. Each side plate is of one-piece construction and is formed of a silicon carbide coated graphite, as are top plate 34 and bottom plate 38. Each side plate includes generally horizontally extending upper and lower webs 50, 52 respectively which are interconnected by two angularly inclined side web sections 54, 56.

As best seen in the top plan view of FIG. 9 (see also FIG. 2) the inner side edges 58 and 60 of the respective upper and lower webs 50 and 52 are straight and are generally coextensive respectively with the sides of the top and bottom plates 34, 38. The side surface sections 54, 56 are symmetrically and oppositely inclined relative to the inner side edges of the top and bottom webs so that when, see FIG. 2, all of the side plates are in their final assembled position, an exterior side surface of a ten-sided regular polygon is formed. As best seen in FIG. 10, the outer side surfaces of sections 54 and 56 are inwardly and upwardly inclined. A plurality of circular pockets 28 are formed in the outer side of each of side sections 54 and 56.

Figure 11:
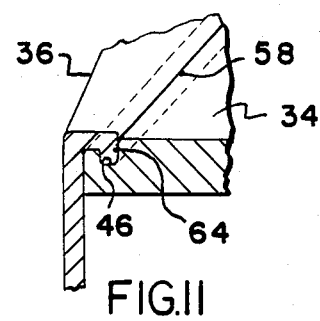
FIG. 11 is a partial perspective view, in cross-section, showing the details of the fit between a side plate and the top plate.

A downwardly projecting flange 64 is formed along the inner side edge of upper web 50 and is conformed, as best seen in FIG. 11, to be received within a groove 46 of top plate 34. A generally similar upwardly projecting flange 66 extends along each inner side edge 60 of lower web 52 and is adapted to be similarly received in the downwardly facing groove 48 of bottom plate 38.

The opposed longitudinal side edges of side plate 36 are formed in configurations complementary to each other as best seen in FIG. 9. One longitudinal side edge 68 is flat and extends at substantially right angles to the inner side edges 58, 60 of the upper and lower webs. The opposed side edge 70 is formed in the shape of an angular notch which is adapted to interfit with the edge 68 of an adjacent side plate in a manner best seen in FIGS. 9 and 2. It will be noted that any radiation seeking to enter the interior of the susceptor between the edges of the side plates would have to follow an angular path. This is, of course, impossible and the linearly traveling radiation is always reflected off and prevented from entering by this configuration. Further because the side plates themselves are angular in plan section, they resist warpage at the extreme temperatures of the reactor far better than individual plates. Moreover, the angular configuration provides a better seal for denying entry of the heated reaction gases to the interior of the susceptor and prevents them from distorting the operation of the interior heat sensors.

The susceptor described above is assembled by first mounting top plate 34 upon shaft 26. The individual side plates are then loaded with discs (such as at D) to be treated and successively hung upon top plate 34 by engaging the flanges 64 in the respective grooves 46 in the manner best shown in FIG. 11. After three adjacent side plates have been so assembled to top plate 34, bottom plate 38 is put in place, and the remaining two side plates are assembled by first hanging them from top plate 34 and then elevating the appropriate edge of bottom plate 38 slightly to permit the flange 66 of the side plate to be engaged within the corresponding groove 48 in the bottom plate 38. When completely assembled, the assembly, in effect, is maintained by gravity with the individual parts firmly interlocked with each other.

To remove a side plate 36, one side of bottom plate 38 is lifted to disengage flange 66 from groove 48 and the lower end of the side plate is then swung outwardly slightly while the side plate is lifted to disengage flange 64 from groove 46. Then the side plate can be moved radially outwardly and placed on a table surface with the disc receiving pockets 62 disposed upwardly so that processed substrates can be removed therefrom and unprocessed discs substituted prior to reassembly.

In FIGS. 12–14 a slightly modified form of susceptor is disclosed which enables the construction of a susceptor of a regular polygonal configuration with an odd number of sides. The circumferential extent of each side surface of the susceptor is largely determined by the diameter of the discs which are to be carried by the susceptor and in some cases an increased holding capacity may be achieved if the susceptor has an odd number of sides.

In the embodiment of FIGS. 12–14, the top plate 34' is of circular configuration and is formed with a continuous circular groove 46' spaced inwardly from and concentric with the periphery of the top plate. The bottom plate (not shown) of the FIG. 12–14 embodiment is of construction substantially similar to the top plate of FIG. 13. Side plates 36' of the FIG. 12–14 embodiment are formed with inner side edges 58' of constant radius as viewed in plan and have a downwardly projecting flange 64' conformed to be received within the notch 46' in generally the same fashion that the flange 64 of the FIG. 1–11 embodiment was received in the groove 46 of the FIG. 1–11 top plate. A similar arrangement is employed for the bottom plate of the FIG. 12–14 embodiment. As was the case in the previously described embodiment, the longitudinal side edges 68',70' of the side plates of the FIG. 12–14 embodiment are complementary to each other and abut in face to face relationship, although in this case edges 68' and 70' are both completely flat and lie in respective planes which are not radial to the central axis of the assembled susceptor.

As best seen in FIG. 12, the FIG. 12–14 embodiment of the susceptor finds four like side plates 36' each having two angularly related side surface sections. The remaining side plate 136 is of an increased circumferential extent as compared to the side plates 36' so that it can have three angularly related side surface sections 136A, 136B and 136C, each of which is of the same dimensions as one of the two side surface sections on the other side plates 36'.

While two embodiments of the invention have been described in detail, it will be apparent to those skilled in the art that the disclosed embodiments may be modified. Therefore, the foregoing description is to be considered exemplary rather than limiting, and the true scope of the invention is that defined in the following claims.

We claim:

1. A susceptor assembly for supporting a plurality of disc-like substrates for high temperature vapor deposition, said assembly comprising geometrically similar top and bottom plates of graphite having upper and lower surfaces and side edges defining outer peripheries; means for supporting said top plate in a horizontal position in symmetrical relationship to a central vertical axis, a plurality of vertically elongate graphite side plates having interior and exterior side surfaces and upper and lower ends, first means for suspending said side plates from said top plate around the outer periphery thereof, said side plates each having a first longitudinal side edge and a second opposed longitudinal side edge of a configuration complementary to said first side edge such that when said side plates are all suspended from said top plate, the first side edge of each side plate is in face to face contact with the second side edge of an adjacent side plate whereby said side plates define an enclosure with an interior, surrounding said central axis, means supporting said bottom plate within the interior of said enclosure, and means on said side plates for mounting a plurality of substrates on the exterior side surface thereof.

2. The invention defined in claim 1 wherein the exterior side surface of each of said side plates is defined by at least two intersecting longitudinally extending planar surfaces and the exterior side surfaces have the horizontal cross sectional configuration of a regular polygon.

3. The invention defined in claim 1 wherein said first means comprises means defining a continuous upwardly opening groove in the upper surface of said top plate spaced a constant distance inwardly from the outer periphery of said top plate, and a downwardly projecting transversely extending flange on the interior side surface of each side plate adjacent the upper end thereof conformed to be received within said groove.

4. The invention defined in claim 1 wherein said means supporting the bottom plate comprises a continuous downwardly opening groove in the lower surface of said bottom plate spaced a constant distance inwardly from the periphery of said bottom plate, and an upwardly projecting transverse flange on the interior side surface of each side plate conformed to be received in said groove in said bottom plate.

5. The invention defined in claim 1 wherein said top and bottom plates are of a regular polygonal configuration.

6. The invention defined in claim 1 wherein said top and bottom plates are of circular shape.

7. The invention defined in claim 2 wherein the exterior side surface of at least one of said side plates has three of said planar surfaces thereon, and the exterior side surfaces of the other side plates have but two of said planar surfaces thereon.

8. The invention defined in claim 1 wherein said longitudinal side edges of said side plates lie in respective planes which have oblique relationship to all planes containing said central axis.

9. The invention defined in claim 1 wherein one side edge of each side plate is formed as an angular notch from top to bottom to receive the side edge of an adjacent side plate.

10. The invention of claim 1 in which each pair of abutting side edges lies substantially in a common plane which does not intersect the said axis.

11. In a radiant heated reactor for affecting a chemical vapor film deposition reaction on heated substrates positioned therein and heated thereby which includes
   A. a radiant heat source, for producing and transmitting radiant heat energy,
   B. means defining a reaction chamber, for receiving therein the substrates to be coated, adjacent said heat source and generally surrounded by the same, said chamber being formed from a material which is transparent to radiant heat energy produced by said radiant heat source, C. conduit means for introducing gaseous reactants into said reaction chamber and for withdrawing spent gaseous reactants from said chamber, and D. a susceptor assembly for supporting a plurality of disc-like substrates for high temperature vapor deposition, said assembly comprising: geometrically similar top and bottom plates, means for supporting said top plate in a horizontal position in symmetrical relationship to a central vertical axis, a plurality of vertically elongate discrete side plates having interior and exterior side surfaces and upper and lower ends, first means for suspending said side plates from said top plate around the outer periphery thereof, there being means on said side plates for mounting a plurality of substrate discs on the exterior side surface thereof, the improvement wherein said side plates each having a first longitudinal side edge and a second opposed longitudinal side edge of a configuration complementary to said first side edge such that when said side plates are all suspended from said top plate, the first side edge of each side plate is in face to face abutting contact with the second side edge of an adjacent side plate whereby said side plates define an enclosure with an interior surrounding said central axis, and second means is provided at the lower ends of said side plates cooperatively supporting said bottom plate within the interior of said enclosure.

12. A method of disassembling a susceptor assembly having a side plate for supporting a plurality of disc-like substrates for high temperature vapor deposition, said assembly comprising geometrically similar top and bottom plates of graphite having upper and lower surfaces and side edges defining outer peripheries; the top plate being supported in a generally horizontal position in symmetrical relationship to a central vertical axis about which it can be rotated, the top plate having an upwardly opening groove in its top surface spaced inwardly from its perimeter; a plurality of vertically elongate discrete graphite side plates individually releasably suspended from said top plate around the outer periphery thereof, said side plates having horizontally inwardly extending webs with downwardly projecting flanges thereon releasably received in said groove, said side plates also each comprising angularly disposed faces and having a first longitudinal side edge and a second opposed longitudinal side edge of a configuration complementary to said first side edge such that, when said side plates are all suspended from said top plate, the first side edge of each side plate is in face to face contact with the second side edge of an adjacent side plate whereby said side plates define an enclosure with an interior surrounding said central axis, the bottom plate having a downwardly opening groove in its lower surface spaced inwardly from its perimeter and the side plates having generally horizontally inwardly extending webs with upwardly projecting flanges thereon received in said downwardly opening groove to releasably cooperatively support said bottom plate within the interior of said enclosure, and each side plate mounting a plurality of substrate discs on the exterior side surface thereof; the steps of:

lifting the bottom plate at one side thereof to disengage the flange on the adjacent side plate from the groove;

raising the said side plate to lift the upper flange on the side plate from the groove in the top plate; and removing the substrate discs from the side plate.

13. The invention defined in claim 11 wherein said longitudinal side edges of said side plates lie in respective planes which have oblique reltionship to all planes containing said central axis.

14. The invention defined in claim 11 wherein the exterior side surface of certain of said side plates is defined by at least two intersecting, longitudinally extending planar surfaces.

15. The invention defined in claim 11 wherein said first means comprises means defining an upwardly opening groove portion in the upper surface of said top plate spaced inwardly from the outer periphery of said top plate, and a downwardly projecting transversely extending flange on the interior side surface of a side plate adjacent the upper end thereof conformed to be received within said groove.

16. The invention defined in claim 15 wherein said second means comprises a downwardly opening groove portion in the lower surface of said bottom plate spaced inwardly from the periphery of said bottom plate, and an upwardly projecting transverse flange on the interior side surface of a side plate conformed to be received in said groove portion in said bottom plate.

17. The invention defined in claim 11 wherein said top and bottom plates are of regular polygonal configuration.

18. The invention defined in claim 11 wherein said top and bottom plates are of circular shape.

19. The invention defined in claim 14 wherein the exterior side surface of at least one of said side plates have three of said planar surfaces thereon and the exterior side surfaces of the other side plates have but two of said planar surfaces thereon.

20. The invention defined in claim 11 wherein one side edge of each side plate is formed as an angular notch from top to bottom to receive the side edge of an adjacent side plate.

* * * * *